(12) United States Patent
Tsai et al.

(10) Patent No.: US 11,821,952 B2
(45) Date of Patent: Nov. 21, 2023

(54) METHOD OF ESTIMATING D-Q AXIS INDUCTANCE OF PERMANENT MAGNET SYNCHRONOUS MOTOR

(71) Applicant: DELTA ELECTRONICS, INC., Taoyuan (TW)

(72) Inventors: Mi-Ching Tsai, Taoyuan (TW); Ting-Chung Hsieh, Taoyuan (TW); Lung-Jay Cheng, Taoyuan (TW); Yao-Sheng Wu, Taoyuan (TW); Chun-Ju Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 483 days.

(21) Appl. No.: 17/077,669

(22) Filed: Oct. 22, 2020

(65) Prior Publication Data

US 2021/0116507 A1  Apr. 22, 2021

(30) Foreign Application Priority Data

Oct. 22, 2019  (TW) .................................. 108137993

(51) Int. Cl.
| | |
|---|---|
| *H02P 21/18* | (2016.01) |
| *H02P 25/03* | (2016.01) |
| *G01R 31/34* | (2020.01) |
| *H02P 6/34* | (2016.01) |
| *G01R 27/26* | (2006.01) |
| *H02P 21/14* | (2016.01) |

(52) U.S. Cl.
CPC ............. *G01R 31/34* (2013.01); *G01R 27/26* (2013.01); *G01R 27/2611* (2013.01); *H02P 6/34* (2016.02); *H02P 21/14* (2013.01); *H02P 2207/05* (2013.01)

(58) Field of Classification Search
CPC .................................. H02P 21/00; H02P 29/64
See application file for complete search history.

(56) References Cited

U.S. PATENT DOCUMENTS

| | | | |
|---|---|---|---|
| 2005/0151502 A1* | 7/2005 | Quirion ................... | H02P 6/181 318/715 |
| 2013/0221885 A1* | 8/2013 | Hunter ..................... | H02P 21/26 318/400.15 |

* cited by examiner

*Primary Examiner* — Kawing Chan
*Assistant Examiner* — Charles S Laughlin
(74) *Attorney, Agent, or Firm* — Muncy, Geissler, Olds & Lowe, P.C.

(57) ABSTRACT

A method of estimating a d-q axis inductance of a permanent magnet synchronous motor includes the following steps. First, building an equivalent motor control block through enabling two of the three phases, and disabling the remaining one of the three phases, and locking a rotor. Afterward, incorporating a back EMF observer into a DC motor control block, and making the DC motor control block correspond to the back EMF observer by commanding an angular speed of the DC motor control block to be zero. Afterward, introducing the equivalent motor control block into the DC motor control block, and using the back EMF observer to estimate the back EMF, and repeating above steps taking turns to disable one phase so as to obtain three sets of motor inductances respectively. Finally, estimating the d-q axis inductance by introducing the three sets of equivalent motor inductances into an inductance relational equation.

13 Claims, 7 Drawing Sheets

METHOD OF ESTIMATING D-Q AXIS INDUCTANCE OF PERMANENT MAGNET SYNCHRONOUS MOTOR

BACKGROUND

Technical Field

The present disclosure relates to method of estimating d-q axis inductance of a permanent magnet synchronous motor, and more particularly to a method of estimating d-q axis inductance by enabling two and disabling the other one of the three phases with a back EMF observer to lock a rotor.

Description of Related Art

The statements in this section merely provide background information related to the present disclosure and do not necessarily constitute prior art.

A permanent magnet synchronous motor (PMSM) refers to a synchronous motor in which a rotor uses permanent magnets instead of coil windings. The rotor includes one or more permanent magnets. Since the PMSM is excited by permanent magnets, it has the main features of high efficiency, high power factor, large starting torque, small size, and light weight. The existing method of measuring the inductances of the PMSM is to lock the rotor at a specific electrical angle, and then to enable any two of the three phases (the equivalent circuit is as shown in FIG. 1) and then to acquire the equivalent inductances by utilizing the concept of circuit impedance. Finally, a d-q axis inductance is estimated through the equivalent inductances.

Since the existing inductance measurement method needs to accurately lock the rotor at the specific electrical angle, or to take an average value after a plurality of measurements in the vicinity of a fixed electrical angle to obtain the inductance information of the d-q axis, the above-mentioned inductance measurement method would cause complicated steps and procedures for measuring the inductance, and the accuracy of the electrical angle directly affects the accuracy of the estimated inductance.

Therefore, how to design a method of estimating the d-q axis inductance of the PMSM, for example, using a back EMF observer that is generally used to estimate the back EMF, rotor speed, or position of the motor, and mathematical derivation to accurately estimate the d-q axis inductance of the motor is an important subject for the inventors of the present disclosure.

SUMMARY

In order to solve the above-mentioned problems, a method of estimating d-q axis inductance of a permanent magnet synchronous motor (PMSM) is provided. The PMSM includes a rotor. The method includes steps of: (S100) locking the rotor of the PMSM, and disabling one of three phases of the PMSM and providing a phase voltage to the other two of the three phases to build an equivalent motor control block comprising a corresponding equivalent motor inductance, (S120) incorporating a back EMF observer into a DC motor control block, (S140) commanding an angular speed of the DC motor control block to be zero so that the DC motor control block is corresponded to the back EMF observer, (S160) introducing the equivalent motor control block into the DC motor control block so that the equivalent motor control block is corresponded to the back EMF observer, and estimating back EMF by the back EMF observer so as to acquire the equivalent motor inductance when one of the three phases is disabled, (S180) repeating steps (S100) through (S160) to acquire the other two equivalent motor inductances when the other two of the three phases are turned to be disabled respectively, and (S200) introducing subtotal three acquired equivalent motor inductances into an inductance relational equation to estimate the d-q axis inductance.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawings as follows.

DETAILED DESCRIPTION

Figure 1:
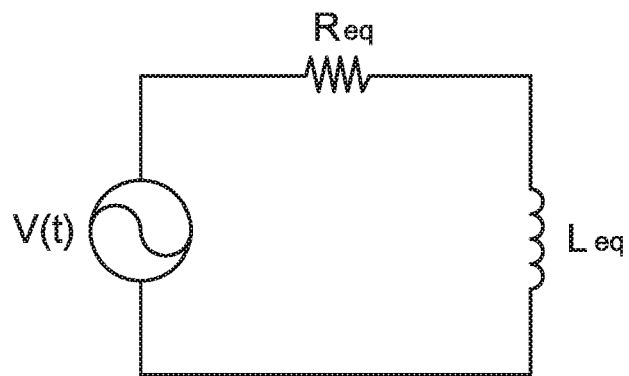
FIG. 1 is an equivalent circuit diagram of two-phase conduction windings of a conventional permanent magnet synchronous motor.

Reference will now be made to the drawing figures to describe the present disclosure in detail. It will be understood that the drawing figures and exemplified embodiments of present disclosure are not limited to the details thereof.

Figure 2:
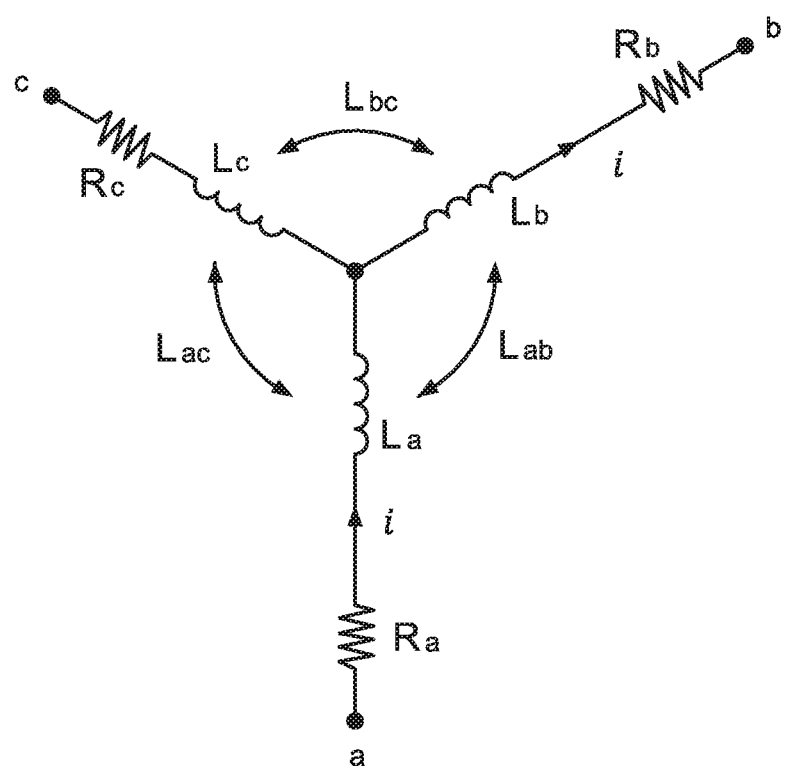
FIG. 2 is a circuit diagram of three-phase windings of a permanent magnet synchronous motor according to the present disclosure.

Please refer to FIG. 2, which shows a circuit diagram of three-phase windings of a permanent magnet synchronous motor according to the present disclosure. The permanent magnet synchronous motor includes a rotor and a stator 100. The stator 100 includes three-phase windings (a, b, c). Each phase winding has a resistance ($R_a$, $R_b$, $R_c$) and an inductance ($L_a$, $L_b$, $L_c$), and an equivalent mutual inductance ($L_{ab}$, $L_{bc}$, $L_{ca}$) involved between two adjacent inductances ($L_a$, $L_b$, $L_a$). The major method of the present disclosure is to enable two phases of the three-phase windings and disable one phase of the three-phase windings to lock the rotor so as to estimate a d-q axis inductance of the permanent magnet synchronous motor. At this condition, an angular speed of the rotor is zero, and an equation can be obtained as follows (it is assumed that the permanent magnet synchronous motor has balanced three-phase windings).

$$V_{xy} = 2Ri + (L_x + L_y - 2L_{xy})\frac{di}{dt} \quad \text{(equation 1)}$$

Figure 3A:
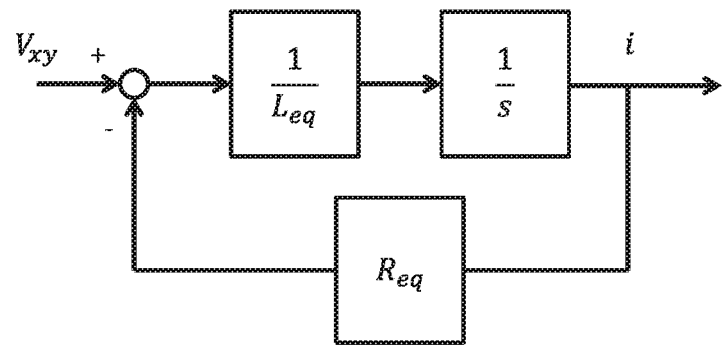
FIG. 3A is an equivalent control block diagram of the permanent magnet synchronous motor with two enabled phases according to the present disclosure.

In which, $V_{xy}$ is a phase voltage between two enabled phases (i.e., $V_{ab}$ is the $V_{xy}$ that phase a and phase b are enabled, and so on), i is a current flowing through the two enabled phases (for example, the a-phase winding and the b-phase winding are enabled, and the current i flows through the a-phase winding and the b-phase winding as shown in FIG. 2), R is a resistance of each phase (it is assumed that $R_a=R_b=R_c$, and $R_a+R_b=2R$ when the a-phase winding and the b-phase winding are enabled). The above equation 1 can be expressed in blocks as shown in FIG. 3A, and FIG. 3A is an equivalent control block diagram of the permanent magnet synchronous motor with two enabled phases according to the present disclosure. In which, $L_{eq}$ is the equivalent motor inductance (i.e., $L_{eq}=L_x+L_y-2L_{xy}$), $L_a+L_b-2L_{ab}$ is the $L_x+L_y-2L_{xy}$ that phase a and phase b are enabled, and so on, $R_{eq}$ is the equivalent motor resistance, and the equivalent motor resistance here is 2R.

Figure 3B:
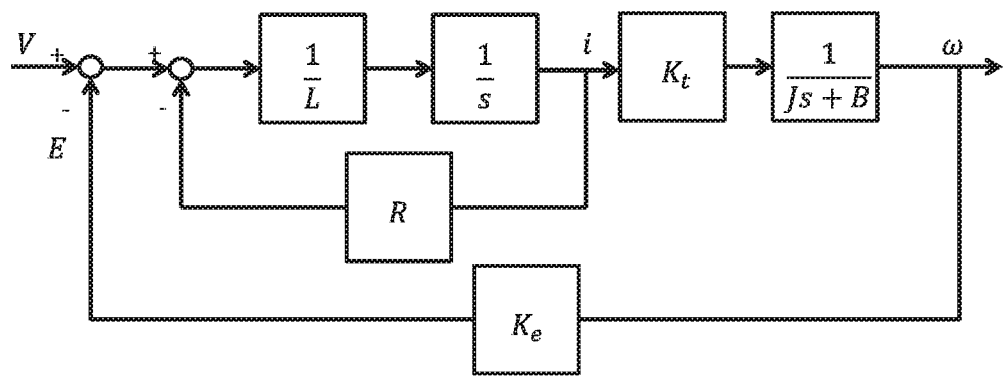
FIG. 3B is a control block diagram of a DC motor according to the present disclosure.
Figure 3C:
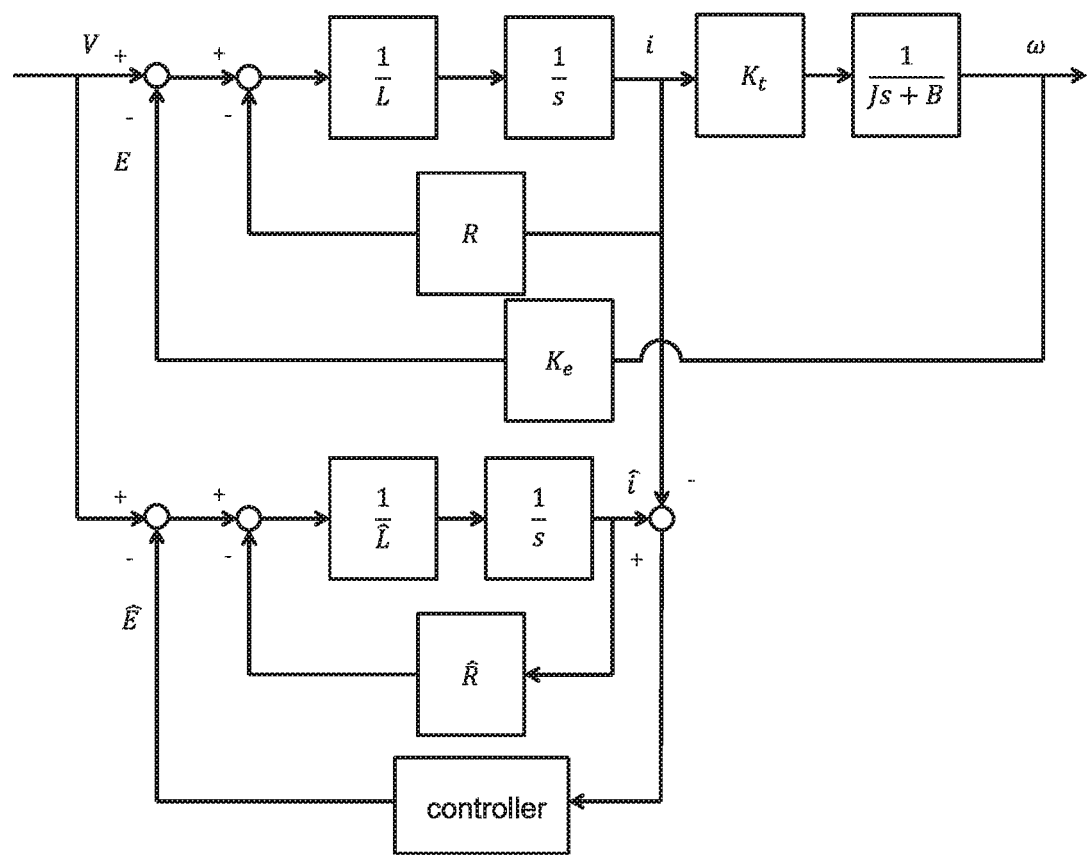
FIG. 3C is a control block diagram of the DC motor having a back EMF observer according to the present disclosure.

Since the rotors of the permanent magnet synchronous motor and the DC motor (such as a brushless DC motor) are composed of permanent magnets, the difference is mainly the distribution of magnetic flux and back EMF. Specifically, the back EMF of the permanent magnet synchronous motor is a sine wave, and that of the brushless DC motor is a trapezoidal wave close to a square wave. Although the permanent magnet synchronous motor is a three-phase AC motor, the effect of enabling two phases and disabling one phase of the three phases and locking the rotor, is equivalent to the control block in which the DC motor locks the rotor. Under this specific condition, therefore, the control block of the permanent magnet synchronous motor can be introduced into the control block of the DC motor. First, the control block diagram of the DC motor according to the present disclosure is shown in FIG. 3B. If a back EMF observer is involved in the control block diagram of the DC motor, the control block diagram can be shown in FIG. 3C.

Figure 3D:
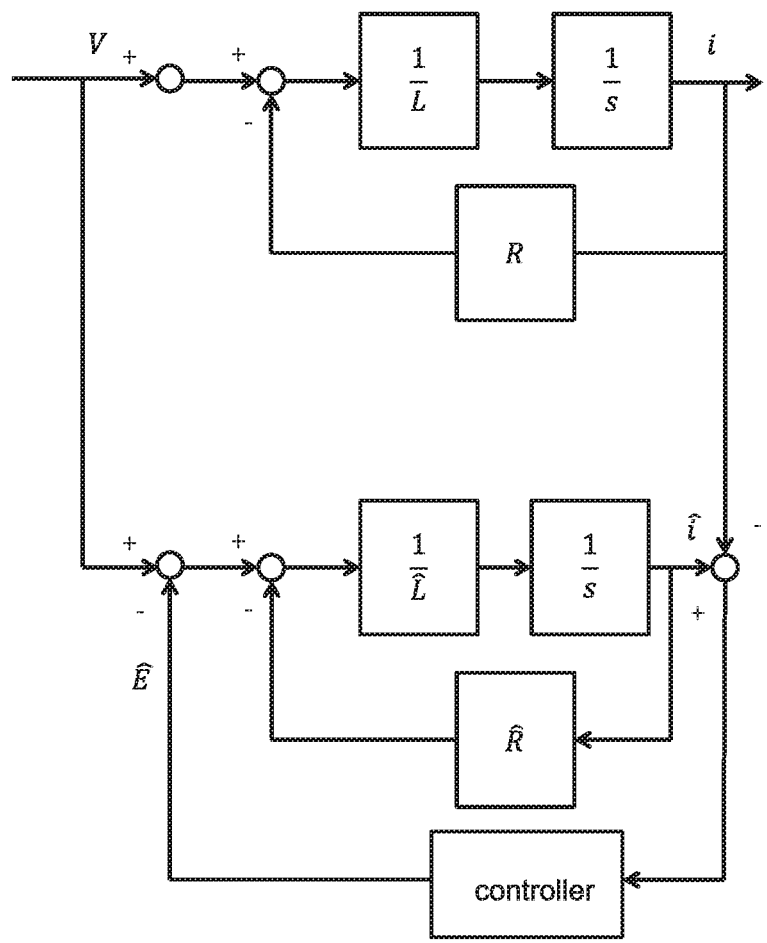
FIG. 3D is a control block diagram of the DC motor operating at zero angular speed according to the present disclosure.
Figure 3E:
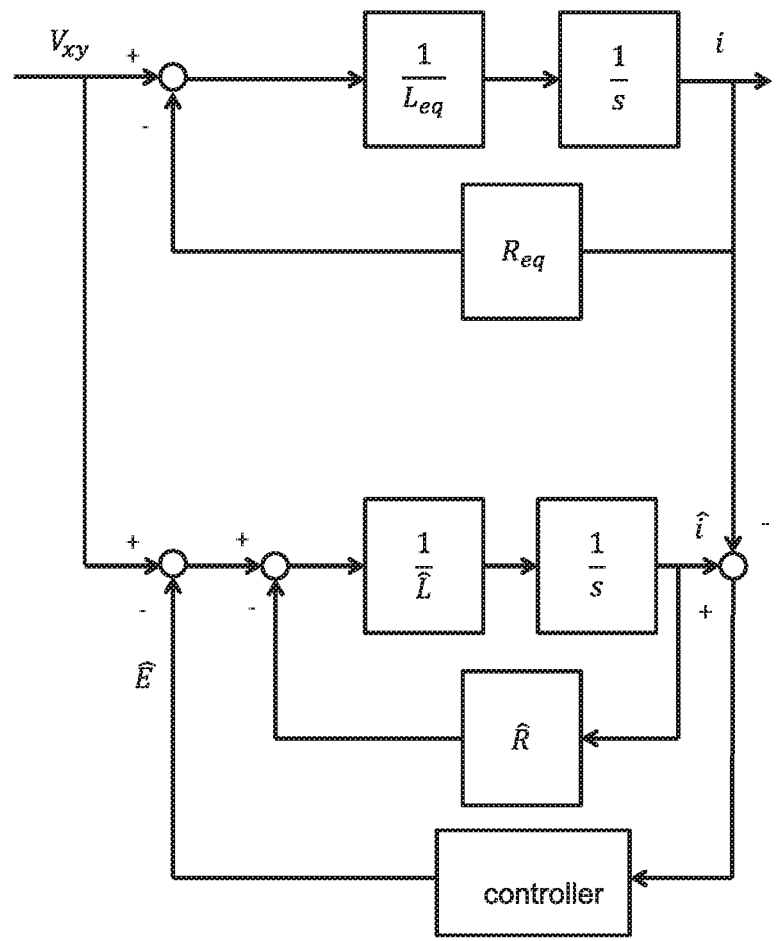
FIG. 3E is a control block diagram of a permanent magnet synchronous motor according to the present disclosure.

Afterward, command the angular speed of the rotor to be zero ($\omega=0$), it means that the rotor of the DC motor is locked. Therefore, a path having the parameters of $K_t$, $$\frac{1}{Js+B},$$

and $K_e$ can be ignored. The DC motor control block with the disappearing parameters of $K_t$, $$\frac{1}{Js+B},$$

and $K_e$ can be incorporated into the control block of the back EMF observer as shown in FIG. 3D, which shows a control block diagram of the DC motor operating at zero angular speed according to the present disclosure. In which, s is a differential operator in Laplace transform, J is an inertia and B is a damping constant. As can be seen from the above control block diagrams, an inductance L of the DC motor corresponds to an observer inductance $\hat{L}$ of the back EMF observer, and a resistance R corresponds to an observer resistance $\hat{R}$ of the back EMF observer. In some embodiments of the present disclosure, the observer inductance $\hat{L}$ is known. Finally, the equivalent motor control block of the equation 1 is introduced into the DC motor control block in which the rotor is locked to acquire the control block diagram of the permanent magnet synchronous motor as shown in FIG. 3E.

The main principle of the above control block diagrams is that the angular speed of the DC motor is zero ($\omega=0$), which means the rotor of the DC motor is locked. At this condition, the control block of the DC motor and the permanent magnet synchronous motor are equal in the condition that both of these two motors are locked. Therefore, the equivalent motor control block of the permanent magnet synchronous motor can be introduced into the control block of the DC motor so that the equivalent motor control block of the permanent magnet synchronous motor is also corresponding to the back EMF observer. If there is no error between the parameters of the back EMF observer and the actual parameters of the permanent magnet synchronous motor, i.e., the observer inductance $\hat{L}$ is equal in value to the equivalent motor inductance $L_{eq}$ and the observer resistance $\hat{R}$ is equal in value to the equivalent motor resistance $R_{eq}$, the estimated back EMF $\hat{E}$ will be equal to zero. On the contrary, if there is any error between the parameters of the back EMF observer and the actual parameters of the permanent magnet synchronous motor, the estimated back EMF $\hat{E}$ will be not equal to zero. Therefore, when the observer resistance $\hat{R}$ of the back EMF observer is equal in value to the equivalent motor resistance $R_{eq}$, the equivalent motor inductance $L_{eq}$ can be acquired according to the estimated back EMF $\hat{E}$ estimated by the back EMF observer to be equal to zero.

Under the condition that a value of a resistance $\hat{R}$ of the back EMF observer in the above system block is equal to a value of the equivalent motor resistance $R_{eq}$, the phase voltage $V_{xy}$ is set to a sine wave voltage command:

$$V_{xy}=V_m \sin(\omega_0 t) \quad \text{(equation 2)}$$

In which, $V_m$ is an amplitude of the sine wave voltage command, $\omega_0$ is a sine wave voltage angular speed. When the phase voltage $V_{xy}$ is set to the sine wave voltage command, the controller in the back EMF observer needs to be set as:

$$K_p + \frac{K_r}{s^2+\omega_0^2} \quad \text{(equation 3)}$$

In which, $K_p$ and $K_r$ are controller parameters, $\omega_0$ is the sine wave voltage angular speed. The reason why the controller is in the form like equation 3 is that the value of the current i of the motor has to be equal to the value of the current $\hat{i}$ of the back EMF observer when the sine wave voltage command is equation 2. In detail, if only DC voltage input is used in this present disclosure, the effect of the inductance will disappear at the steady state. Therefore, it is necessary to use the sine wave voltage command input to retain the influence information of the inductance error on the system and to increase the effect of the amount of inductance influence. The current i of the motor control block is a current flowing through the two enabled phases of the three phases, and the current i of the motor control block can be expressed as:

$$i = \frac{V_{xy}}{L_{eq}s+R_{eq}} \quad \text{(equation 4)}$$

The current $\hat{i}$ of the back EMF observer can be expressed as:

$$\hat{i} = \frac{1}{\hat{L}s + \hat{R}}(V_{xy} - \hat{E}) \quad \text{(equation 5)}$$

In which, the conditions of equation 4 being equal to equation 5 and $R_{eq}$ being equal to $\hat{R}$ are introduced into the equation 2 to acquire:

$$L_{abc} = \begin{bmatrix} L_a & L_{ab} & L_{ac} \\ L_{ba} & L_b & L_{bc} \\ L_{ca} & L_{cb} & L_c \end{bmatrix} \quad \text{(equation 7)}$$

$$= \begin{bmatrix} L_m + L_l - L_v\cos 2\theta_e & -\frac{1}{2}L_m - L_v\cos\left(2\theta_e - \frac{2}{3}\pi\right) & -\frac{1}{2}L_m - L_v\cos\left(2\theta_e + \frac{2}{3}\pi\right) \\ -\frac{1}{2}L_m - L_v\cos\left(2\theta_e - \frac{2}{3}\pi\right) & L_m + L_l - L_v\cos\left(2\theta_e + \frac{2}{3}\pi\right) & -\frac{1}{2}L_m - L_v\cos 2\theta_e \\ -\frac{1}{2}L_m - L_v\cos\left(2\theta_e + \frac{2}{3}\pi\right) & -\frac{1}{2}L_m - L_v\cos 2\theta_e & L_m + L_l - L_v\cos\left(2\theta_e - \frac{2}{3}\pi\right) \end{bmatrix}$$

$$i = \hat{i} \rightarrow L_{eq} = \hat{L} + \frac{\hat{E}_m}{I_m \times \omega_0}\cos(\angle\hat{E} - \angle i - 90°) \quad \text{(equation 6)}$$

In which, $\hat{E}_m$ is an amplitude of an estimated back EMF, $I_m$ is an amplitude of the current i. In the equation 6, the amplitude of the estimated back EMF $\hat{E}$ can be converged to zero through iterative methods, such as Newton's method, gradient descent method, conjugate iterative method, variable scale iterative method, least squares method, and so on. Also, it is to verify whether the estimated parameters are correct or not, and finally to calculate and acquire an equivalent motor inductance $L_{eq}$. When the amplitude of the estimated back EMF $\hat{E}_m$ is converged to zero, it means that there is no error between the parameters of the motor control block and the parameters of the back EMF observer so that the correct equivalent motor inductance $L_{eq}$ can be acquired. The equivalent motor inductance $L_{eq}$ acquired from the equation 1 to equation 6 is an equivalent motor inductance that one of the three phases is disabled, for example, $L_{eq\_a\_close}$ means the equivalent motor inductance that the a-phase winding is disabled. Similarly, $L_{eq\_b\_close}$ and $L_{eq\_c\_close}$ can be acquired by repeating from the equation 1 to equation 6. Finally, the d-q axis inductance can be accurately estimated by introducing the acquired three equivalent motor inductances ($L_{eq\_a\_close}$, $L_{eq\_b\_close}$, $L_{eq\_c\_close}$) into the inductance relational equation.

Specifically, the three equivalent motor inductances:

$$L_{eq\_a\_close} = L_b + L_c - 2L_{bc},$$

$$L_{eq\_b\_close} = L_a + L_c - 2L_{ca}, \text{ and}$$

$$L_{eq\_c\_close} = L_a + L_b - 2L_{ab}.$$

The above three equivalent motor inductances are introduced into the inductance relational equation to estimate the accurate d-q axis inductance. In particular, the inductance relational equation includes a three-phase inductance relational equation and a d-q axis inductance relational equation. The three equivalent motor inductances are introduced into the three-phase inductance relational equation to solve inductance parameters, and then the inductance parameters are introduced into the d-q axis inductance relational equation to estimate the accurate d-q axis inductance.

Further, the three-phase inductance relational equation is:

In which, $L_m$ is a magnetizing inductance, $L_t$ is an average inductance (minus leakage), $L_v$ is a salient pole inductance variation, $\theta_e$ is an electric angle, and $L_m$, $L_v$, $2\theta_e$ are variables that need to be solved or referred to as inductance parameters. The three equivalent motor inductances ($L_{eq\_a\_close}$, $L_{eq\_b\_close}$, $L_{eq\_c\_close}$) are introduced into the equation 7 to acquire:

the relational equation of disabling the phase a winding:

$$L_{eq\_a\_close} = L_b + L_c - 2L_{bc} = 3[L_m - L_v\cos 2\theta_e] \quad \text{(equation 8)}$$

the relational equation of disabling the phase b winding:

$$L_{eq\_b\_close} = L_a + L_c - 2L_{ac} = 3\left[L_m - L_v\cos\left(2\theta_e + \frac{2\pi}{3}\right)\right] \quad \text{(equation 9)}$$

the relational equation of disabling the phase c winding:

$$L_{eq\_c\_close} = L_a + L_b - 2L_{ab} = 3\left[L_m - L_v\cos\left(2\theta_e + \frac{2\pi}{3}\right)\right] \quad \text{(equation 10)}$$

The three equivalent motor inductances ($L_{eq\_a\_close}$, $L_{eq\_b\_close}$, $L_{eq\_c\_close}$) can be acquired according to equation 1 to equation 6, and the three equivalent motor inductances are introduced into equation 8 to equation 10 to acquire the magnetizing inductance $L_m$, the salient pole inductance variation $L_v$, and the electric angle $\theta_e$ ($2\theta_e$). Finally, the magnetizing inductance $L_m$ and the salient pole inductance variation $L_v$ are introduced into the d-q axis inductance relational equation to estimate the accurate d-q axis inductance.

The d-axis inductance relational equation is:

$$L_d = 3/2(L_m - L_v) \quad \text{(equation 11)}$$

The q-axis inductance relational equation is:

$$L_q = 3/2(L_m + L_v) \quad \text{(equation 12)}$$

The magnetizing inductance $L_m$ and the salient pole inductance variation $L_v$ are introduced into the equation 11 and equation 12 to estimate the d-q axis inductance.

If the permanent magnet is arranged outside the rotor, the permanent magnet synchronous motor is referred to as a surface permanent magnet (SPM) synchronous motor (i.e., surface mounted type), that is, $L_v=0$ and the d-axis inductance $L_d$ is equal to the q-axis inductance $L_q$. If the permanent magnet is arranged inside the rotor, the permanent magnet synchronous motor is referred to as an interior permanent magnet (IPM) synchronous motor (i.e., interior type), that is, $L_v \neq 0$ and the d-axis inductance $L_d$ is not equal to the q-axis inductance $L_q$. If the permanent magnet synchronous motor is the SPM synchronous motor, regardless of the angle at which the rotor is locked, the d-q axis inductance estimated by the method of estimating the d-q axis inductance of the permanent magnet synchronous motor according to the present disclosure may be deviated from the actual measured d-q axis inductance less than 1%. If the permanent magnet synchronous motor is the IPM synchronous motor, regardless of the angle at which the rotor is locked, the d-axis inductance estimated by the method of estimating the d-q-axis inductance of the permanent magnet synchronous motor according to the present disclosure may be deviated from the actual measured d-axis inductance less than 10%, and the estimated q-axis inductance may be deviated from the actual measured q-axis inductance less than 3%.

Figure 4:
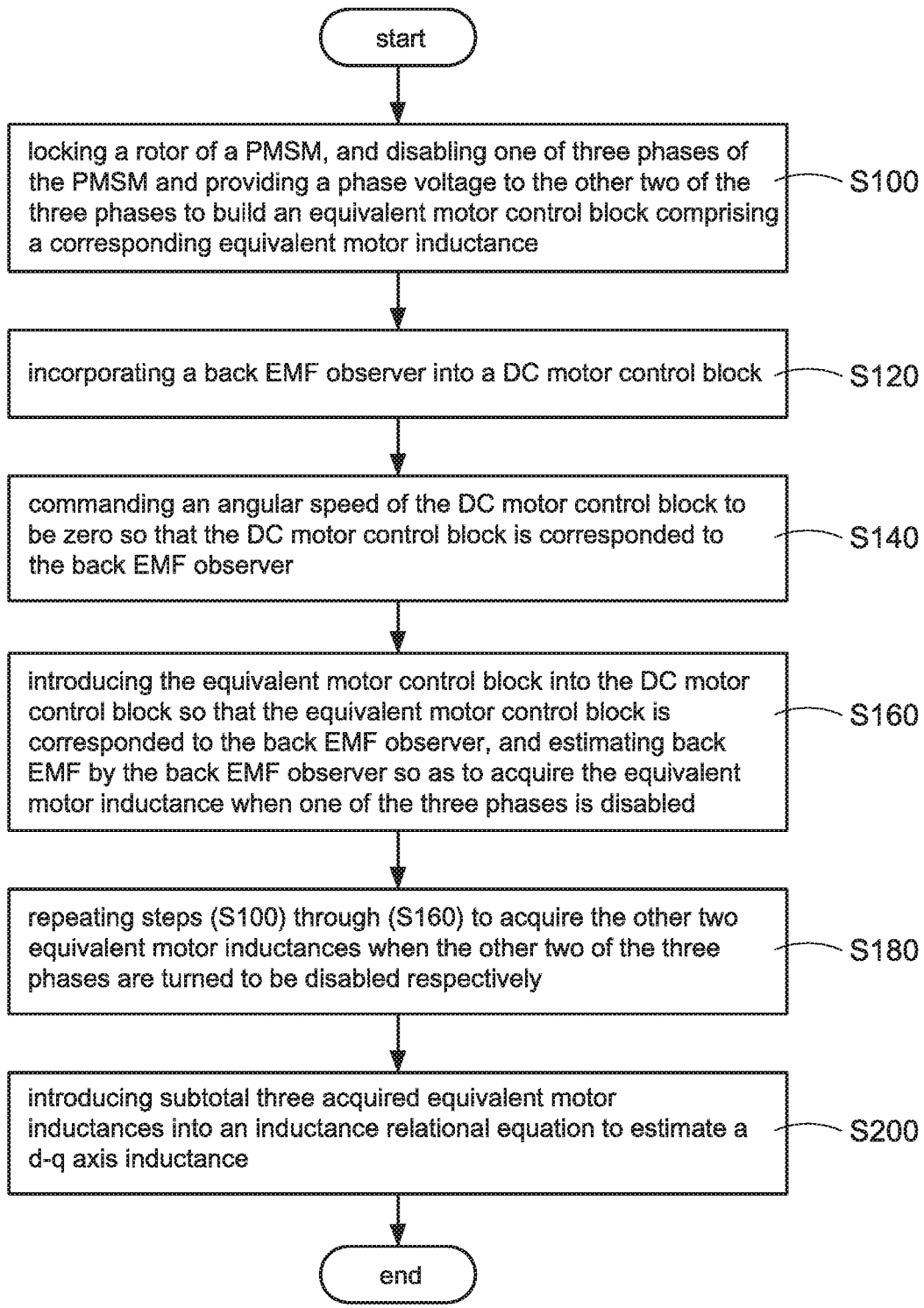
FIG. 4 is a flowchart of estimating d-q axis inductance of the permanent magnet synchronous motor by a back EMF observer according to the present disclosure.

Please refer to FIG. 4, which shows a flowchart of estimating d-q axis inductance of the permanent magnet synchronous motor by a back EMF observer according to the present disclosure, and also refer to FIG. 2 to FIG. 3E. The method of estimating the d-q axis inductance of the permanent magnet synchronous motor includes the following steps. First, a rotor of the motor is locked and one of the three phases is disabled, and a voltage is provided to the other two of the three phases to build an equivalent motor control block (S100). The equivalent motor control block corresponds to the equation 1; the $L_x+L_y-2L_{xy}$ in the equation 1 expresses an equivalent motor inductance while disabling the corresponding phase winding, and the 2R in the equation 1 expresses an equivalent motor resistance. Afterward, a back EMF observer is incorporated into a DC motor control block (S120). Although the permanent magnet synchronous motor is a three-phase AC motor, the effect of the three-phase windings in which two phases of windings are enabled and the other one phase of windings is disabled with the locked rotor, which is exactly the same as a control block in which the DC motor locks the rotor. Therefore, a DC motor system block can be built by a control block of the DC motor and a control block of a back EMF observer. In which, the back EMF observer includes an observer inductance $\hat{L}$ and an observer resistance $\hat{R}$.

Afterward, commanding an angular speed of the DC motor control block to be zero so that the DC motor control block is corresponded to the back EMF observer (S140). Command the angular speed to be zero ($\omega=0$), it means that the rotor of the DC motor is locked. Therefore, a path having the parameters of $K_t$, $$\frac{1}{Js+B},$$

and $K_e$ can be ignored, and the DC motor control block with the disappearing parameters of $K_t$, $$\frac{1}{Js+B},$$

and $K_e$ can correspond to the control block of the back EMF observer. That is, a value of the inductance L of the DC motor corresponds to a value of the observer inductance $\hat{L}$ of the back EMF observer, and a value of the resistance R of the DC motor corresponds to a value of the observer resistance $\hat{R}$ of the back EMF observer. Afterward, the equivalent motor control block is introduced into the DC motor control block so that the equivalent motor control block is corresponded to the back EMF observer, and a back EMF is estimated by the back EMF observer to acquire an equivalent motor inductance corresponding one of the three phases which is disabled (S160). The main principle of introducing the motor control block of the permanent magnet synchronous motor into the control block of the DC motor is that the rotor of the DC motor is locked when the angular speed of the DC motor is zero ($\omega=0$). At this condition, the control block of the DC motor and the permanent magnet synchronous motor are equal in the condition that both of these two motors are locked. Therefore, the motor control block of the permanent magnet synchronous motor can be introduced into the control block of the DC motor so that the motor control block of the permanent magnet synchronous motor is also corresponding to the block of the back EMF observer.

Afterward, the steps (S100) through (S160) are repeated to respectively disable the other two of the three phases in turn. The back EMF observer is used to estimate the back EMF to acquire the other two equivalent motor inductances corresponding to the other two of the three phases which are disabled (S180). If there is no error between the parameters of the back EMF observer and the parameters of the permanent magnet synchronous motor, the observer inductance $\hat{L}$ is equal in value to the equivalent motor inductance $L_{eq}$ and the observer resistance $\hat{R}$ is equal in value to the equivalent motor resistance $R_{eq}$, and the estimated back EMF $\hat{E}$ will be equal to zero. Therefore, the three equivalent motor inductances ($L_{eq\_a\_close}$, $L_{eq\_b\_close}$, $L_{eq\_c\_close}$) can be acquired by estimating the back EMF $\hat{E}$ to be zero by the back EMF observer when the value of the observer resistance $\hat{R}$ of the back EMF observer is equal in value to the value of the equivalent motor resistance $R_{eq}$ but the value of the observer inductance $\hat{L}$ is not equal in value to the equivalent motor inductance $L_{eq}$. Finally, the three equivalent motor inductances are introduced into the inductance relational equation to estimate the d-q axis inductance (S200). The inductance relational equation includes a three-phase inductance relational equation and a d-q axis inductance relational equation. The three equivalent motor inductances ($L_{eq\_a\_close}$, $L_{eq\_b\_close}$, $L_{eq\_c\_close}$) are introduced into the three-phase inductance relational equation to solve the inductance parameters, and then the inductance parameters are introduced into the d-q axis inductance relational equation to accurately estimate the d-q axis inductances.

In conclusion, the present disclosure has following features and advantages:
1. The main effect of the present disclosure is that the method of estimating the d-q axis inductance of the permanent magnet synchronous motor utilizes the back EMF observer which is generally used to estimate the back EMF, rotor velocity or position of the motor, and the mathematical derivation to estimate the d-q axis inductance of the motor so the d-q axis inductance of the motor can be accurately estimated without locking the rotor at the specific electrical angle or without knowing the position information of the motor.

2. Since the d-q axis of the motor can be estimated only by using the back EMF observer with enabling two of the three phases and disabling the other one of the three phases, the principle of the estimation method is simple and there is no complicated mathematical calculation and coordinate conversion so that the d-q axis inductance of the motor can be simply and quickly estimated.

3. If the permanent magnet synchronous motor is the SPM synchronous motor (i.e., surface mounted type), regardless of the angle at which the rotor is locked, the d-q axis inductance estimated by the method of estimating the d-q axis inductance of the permanent magnet synchronous motor according to the present disclosure may be deviated from the actual measured d-q axis inductance less than 1%. If the permanent magnet synchronous motor is the IPM synchronous motor (i.e., interior type), regardless of the angle at which the rotor is locked, the d-axis inductance estimated by the method of estimating the d-q-axis inductance of the permanent magnet synchronous motor according to the present disclosure may be deviated from the actual measured d-axis inductance less than 10%, and the estimated q-axis inductance may be deviated from the actual measured q-axis inductance less than 3%. Therefore, the method of estimating the d-q axis inductance of the permanent magnet synchronous motor of the present disclosure can be applied to both the surface permanent magnet (SPM) structure motor and the interior permanent magnet (IPM) structure motor to achieve a wide range of applicability.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A method of estimating a d-q axis inductance of a permanent magnet synchronous motor (PMSM), the PMSM comprising a rotor and a stator having three-phase windings, and the method comprising steps of:
   (S10) locking the rotor of the PMSM, and disabling one of the three-phase windings of the PMSM;
   (S11) providing a phase voltage to the other two of the three-phase windings to acquire a motor current of the PMSM which is described according to an equivalent DC motor model incorporating an equivalent motor inductance of the other two of the three-phase windings, wherein an angular speed of the equivalent DC motor model is zero when the rotor of the PMSM is locked;
   (S12) providing the phase voltage to the other two of the three-phase windings to acquire a back EMF current which is described according to a back EMF observer model;
   (S13) generating a first equation in which the motor current is equal to the back EMF current to calculate the equivalent motor inductance of the other two of the three-phase windings;
   (S14) repeating steps (S10) through (S13) to acquire the other two equivalent motor inductances when the other two of the three-phase windings are turned to be disabled respectively; and
   (S15) introducing subtotal three acquired equivalent motor inductances into an inductance relational equation to estimate the d-q axis inductance.

2. The method of estimating the d-q axis inductance of the PMSM in claim 1, wherein a second equation describing the equivalent DC motor model is:

$$V_{xy} = 2Ri + (L_x + L_y - 2L_{xy})\frac{di}{dt},$$

wherein $V_{xy}$ is the phase voltage, i is the motor current flowing through the other two of the three-phase windings, $L_x+L_y-2L_{xy}$ is the equivalent motor inductance, and 2R is an equivalent motor resistance.

3. The method of estimating the d-q axis inductance of the PMSM in claim 2, wherein a third equation describing the back EMF observer model is:

$$V_{xy} = \hat{E} + \hat{i}(\hat{L} + \hat{R}),$$

wherein $V_{xy}$ is the phase voltage, $\hat{E}$ is an estimated back EMF, $\hat{i}$ is the back EMF current, $\hat{L}$ is an observer inductance which is equal to the equivalent motor inductance, and $\hat{R}$ is an observer resistance which is equal to the equivalent motor resistance.

4. The method of estimating the d-q axis inductance of the PMSM in claim 3, wherein the phase voltage is a sine wave voltage to be described by:

$$V_m \sin(\omega_0 t),$$

wherein $V_m$ is an amplitude of the sine wave voltage, and $\omega_0$ is a sine wave voltage angular speed.

5. The method of estimating the d-q axis inductance of the PMSM in claim 3, wherein the step (S13) further comprises: using an iterative method to the first equation to make the estimated back EMF be converged to zero so as to acquire the equivalent motor inductance.

6. The method of estimating the d-q axis inductance of the PMSM in claim 1, wherein the PMSM has an a-phase winding, a b-phase winding and a c-phase winding, and corresponding equations of the equivalent motor inductances are:

$L_{a\_close} = L_b + L_c - 2L_{bc}$, when the a-phase winding is disabled, $L_{b\_close} = L_a + L_c - 2L_{ac}$, when the b-phase winding is disabled, and $L_{c\_close} = L_a + L_b - 2L_{ab}$, when the c-phase winding is disabled, wherein $L_a$, $L_b$, $L_c$ are respectively an equivalent inductance of each phase winding, and $L_{ab}$, $L_{bc}$, $L_{ac}$ are respectively an equivalent mutual inductance between each two of the three phases windings.

7. The method of estimating the d-q axis inductance of the PMSM in claim 6, wherein the inductance relational equation comprises a three-phase inductance relational equation and a d-q axis inductance relational equation; at least one inductance parameter is solved by introducing the three acquired equivalent motor inductances into the three-phase inductance relational equation; and the d-q axis inductance is estimated by introducing the at least one inductance parameter into the d-q axis inductance relational equation.

8. The method of estimating the d-q axis inductance of the PMSM in claim 7, wherein the three-phase inductance relational equation is:

$$L_{abc} = \begin{bmatrix} L_a & L_{ab} & L_{ac} \\ L_{ba} & L_b & L_{bc} \\ L_{ca} & L_{cb} & L_c \end{bmatrix}$$

$$= \begin{bmatrix} L_m + L_l - L_v\cos2\theta_e & -\frac{1}{2}L_m - L_v\cos\left(2\theta_e - \frac{2}{3}\pi\right) & -\frac{1}{2}L_m - L_v\cos\left(2\theta_e + \frac{2}{3}\pi\right) \\ -\frac{1}{2}L_m - L_v\cos\left(2\theta_e - \frac{2}{3}\pi\right) & L_m + L_l - L_v\cos\left(2\theta_e + \frac{2}{3}\pi\right) & -\frac{1}{2}L_m - L_v\cos2\theta_e \\ -\frac{1}{2}L_m - L_v\cos\left(2\theta_e + \frac{2}{3}\pi\right) & -\frac{1}{2}L_m - L_v\cos2\theta_e & L_m + L_l - L_v\cos\left(2\theta_e - \frac{2}{3}\pi\right) \end{bmatrix},$$

wherein $L_m$ is a magnetizing inductance, $L_l$ is an average inductance, $L_v$ is a salient pole inductance variation, $\theta_e$ is an electric angle, and $L_m$, $L_v$, $2\theta_e$ are the inductance parameters.

9. The method of estimating the d-q axis inductance of the PMSM in claim 7, wherein the d-q axis inductance relational equation comprises:
a d-axis inductance relational equation: $L_d = 3/2(L_m - L_v)$, and
a q-axis inductance relational equation: $L_q = 3/2(L_m + L_v)$,
wherein $L_m$ is a magnetizing inductance, and $L_v$ is a salient pole inductance variation.

10. The method of estimating the d-q axis inductance of the PMSM in claim 1, wherein the estimated d-q axis inductance is deviated from an actual d-q axis inductance less than 10% regardless of the angle at which the rotor is locked.

11. The method of estimating the d-q axis inductance of the PMSM in claim 10, wherein when the PMSM is interior type, the estimated q-axis inductance is deviated from an actual q-axis inductance less than 3%.

12. The method of estimating the d-q axis inductance of the PMSM in claim 10, wherein when the PMSM is surface mounted type, the estimated d-q axis inductance is deviated from an actual d-q axis inductance less than 1%.

13. The method of estimating the d-q axis inductance of the PMSM in claim 4, wherein the third equation describing the back EMF observer model is added by:

$$K_p + \frac{K_r}{s^2 + \omega_0^2},$$

wherein $K_p$ and $K_r$ are constant parameters, and $\omega_0$ is the sine wave voltage angular speed.

* * * * *